United States Patent
Yamazaki et al.

[11] Patent Number: 6,149,984
[45] Date of Patent: *Nov. 21, 2000

[54] LASER IRRADIATION METHOD

[75] Inventors: Shunpei Yamazaki, Tokyo; Naoto Kusumoto, Kanagawa, both of Japan

[73] Assignee: Semiconductor Energy Laboratory, Inc., Japan

[*] Notice: This patent is subject to a terminal disclaimer.

[21] Appl. No.: 09/304,808

[22] Filed: May 3, 1999

Related U.S. Application Data

[63] Continuation of application No. 08/728,409, Oct. 9, 1996, Pat. No. 5,925,421.

[30] Foreign Application Priority Data

Oct. 15, 1995 [JP] Japan ................................. 7-293742
Oct. 15, 1995 [JP] Japan ................................. 7-293744

[51] Int. Cl.[7] ........................... C23C 14/04; H01L 21/31; H01L 21/42
[52] U.S. Cl. ........................... 427/526; 118/70; 118/600; 427/173; 427/225; 427/294; 427/399; 427/444; 427/554; 427/555; 427/572; 427/574; 427/578; 438/759; 438/795
[58] Field of Search ................................. 427/534, 294, 427/399, 554, 555, 572, 574, 578, 173, 225, 526, 444; 118/70, 600; 438/759, 795

[56] References Cited

U.S. PATENT DOCUMENTS 5,925,421  7/1999  Yamazaki et al. .

FOREIGN PATENT DOCUMENTS

| | | |
|---|---|---|
| 63-14421 | 1/1988 | Japan . |
| 1-115123 | 5/1989 | Japan . |
| 1-145809 | 6/1989 | Japan . |
| 3-146681 | 6/1991 | Japan . |
| 4-313373 | 11/1992 | Japan . |
| 5-055184 | 3/1993 | Japan . |
| 5-129246 | 5/1993 | Japan . |
| 6-302565 | 10/1994 | Japan . |
| 7-065999 | 3/1995 | Japan . |
| 7-086169 | 3/1995 | Japan . |

OTHER PUBLICATIONS

Mori, K. "Evaluation of Electric Transport Properties of Undoped Poly–Si Films", Ricoh Technical Report, No. 21, Jul. 1992, pp. 11–18 (English Abstract included).

*Primary Examiner*—Bernard Pianalto
*Attorney, Agent, or Firm*—Fish & Richardson P.C.

[57] ABSTRACT

In processing an object by irradiating it with laser light, a laser irradiation chamber is evacuated to a pressure value suitable for the intended laser light processing and the laser light processing is performed with the pressure in the chamber kept constant at the above value. Further, electrodes are provided in the laser irradiation chamber, and the inside of the chamber is cleaned by introducing an etching gas into the chamber during or immediately before the laser light irradiation and rendering the etching gas active.

16 Claims, 6 Drawing Sheets

LASER IRRADIATION METHOD

This application is a continuation of Ser. No. 08/728,409, Oct. 9, 1996, U.S. Pat. No. 5,925,421.

BACKGROUND OF THE INVENTION

1. Field of the Invention

The present invention relates to a laser irradiating apparatus and method.

2. Description of Related Art

Conventionally, laser light is used to crystallize or anneal a semiconductor layer in manufacture of a semiconductor device.

In processing a subject surface by laser light irradiation or in performing annealing or crystallization by laser light irradiation to form a semiconductor film, a high-vacuum state is once established in a chamber where laser light irradiation is to be performed (called a laser irradiation chamber in this specification) by a vacuum pump before the laser light irradiation is started. Thus, a gas such as oxygen is introduced into the chamber to provide a pressure suitable for processing.

However, there is a problem that when crystallization to form a semiconductor film is performed by laser light irradiation according to the above procedure, a resulting semiconductor film does not have proper characteristics.

Further, where a semiconductor layer is irradiated with laser light in the laser irradiation chamber, there occurs a phenomenon that Si that constitutes the semiconductor layer or a metal such as B or P (in irradiation after ion implantation) is emitted from an irradiated portion of the semiconductor surface and sticks to the inside surfaces of the irradiation chamber.

If such impurities stick to, for instance, a window through which laser light is to pass, there occur various problems such as reduction in laser light intensity. Conventionally, when the inside of the laser irradiation chamber is polluted in this manner, the inside of the chamber is cleaned to eliminate pollutants, which is conducted every time laser processing is performed a predetermined number of times. For example, this is done such that the irradiation chamber itself is disassembled and pollutants are wiped off the components being immersed in a cleaning liquid.

It may also be the case that a native oxide film, an organic material, or the like is formed on a substrate.

However, where pollutants (contaminations) are removed by cleaning the inside of the laser irradiation chamber, the cleaning takes long time, resulting in a considerable reduction in the operation efficiency of the laser irradiation apparatus. It is desired to solve this problem.

Where a semiconductor layer is crystallized or annealed in such a polluted laser irradiation chamber in a process of manufacturing thin film transistors (TFT), pollutants influence the characteristics of completed TFTs.

SUMMARY OF THE INVENTION

The present invention has been made in view of the above problems in the art, and has an object of producing a high-quality film through laser irradiation processing on a film that is sensitive to impurities, such as a semiconductor film that has been subjected to laser light irradiation. Another object of the invention is to facilitate cleaning of a laser irradiation apparatus, thereby improving its working efficiency.

To attain the above objects, the invention employs the following constitution.

First Constitution

A laser irradiation method comprises the steps of keeping a pressure suitable for processing in a laser irradiation chamber constant; and processing an object by irradiating it with laser light in the laser irradiation chamber.

Second Constitution

A laser irradiation method comprises the steps of keeping a pressure suitable for crystallization in a laser irradiation chamber constant; and crystallizing a non-single-crystal semiconductor layer formed on a substrate by irradiating the non-single-crystal semiconductor layer with laser light in the laser irradiation chamber.

Third Constitution

A laser irradiation method comprises the steps of keeping a pressure suitable for annealing in a laser irradiation chamber constant; and annealing a non-single-crystal semiconductor layer formed on a substrate by irradiating the non-single-crystal semiconductor layer with laser light in the laser irradiation chamber.

Fourth Constitution

A laser irradiation apparatus comprises means for placing an object to be processed inside the laser irradiation apparatus; means for irradiating the object with laser light; and an electrode for supplying electrical energy to a space inside the laser irradiation chamber.

Fifth Constitution

A laser irradiation apparatus comprises means for placing an object to be processed inside the laser irradiation apparatus; means for irradiating the object with laser light; and a pair of electrodes attached to opposed side walls of the laser irradiation chamber, for supplying electrical energy to a space inside the laser irradiation chamber.

Sixth Constitution

A laser irradiation apparatus comprises means for placing an object to be processed inside the laser irradiation apparatus; means for irradiating the object with laser light; and a pair of electrodes provided along the same wall of the laser irradiation chamber, for supplying electrical energy to a space inside the laser irradiation chamber.

Seventh Constitution

A laser irradiation method is provided wherein a non-single-crystal semiconductor layer formed on a substrate is crystallized by irradiating the non-single-crystal semiconductor layer with laser light in a laser irradiation chamber, and, at the same time, the inside of the laser irradiation chamber is cleaned.

Eighth Constitution

A laser irradiation method is provided wherein a non-single-crystal semiconductor layer formed on a substrate is annealed by irradiating the non-single-crystal semiconductor layer with laser light in a laser irradiation chamber, and, at the same time, the inside of the laser irradiation chamber is cleaned.

Ninth Constitution

A laser irradiation method comprises the steps of keeping a pressure suitable for crystallization in a laser irradiation chamber constant; and crystallizing a non-single-crystal semiconductor layer formed on a substrate by irradiating the non-single-crystal semiconductor layer with laser light in the laser irradiation chamber, and, at the same time, cleaning the inside of the laser irradiation chamber.

Tenth Constitution

A laser irradiation method comprises the steps of keeping a pressure suitable for annealing in a laser irradiation chamber constant; and annealing a non-single-crystal semiconductor layer formed on a substrate by irradiating the non-single-crystal semiconductor layer with laser light in the laser irradiation chamber, and, at the same time, cleaning the inside of the laser irradiation chamber.

The invention has a feature that the pressure in a laser irradiation chamber is reduced by a vacuum pump to a value suitable for processing and the processing is effected with the pressure kept constant at this value, without establishing a high-vacuum state in the irradiation chamber by the vacuum pump.

In the invention, the term "keeping the pressure constant" means that the pressure is not increased or decreased intentionally once it has reached a value suitable for crystallization, annealing, or some other laser processing.

DETAILED DESCRIPTION OF THE PREFERRED EMBODIMENTS

Embodiment 1

This embodiment is directed to a case where instead of establishing a high-vacuum state in a laser irradiation chamber before laser light irradiation, a vacuum degree necessary for intended processing is gradually established while a gas of an atmosphere that is necessary for laser light irradiation is caused to flow.

This embodiment will be described for crystallizing an active layer of a thin film semiconductor layer by laser light irradiation. Brief description will be made of steps to formation of an active layer of a thin film transistor (TFT) which is a subject of laser light irradiation.

A 3,000-Å-thick silicon oxide film as an undercoat film is formed on a glass substrate by plasma chemical vapor deposition (CVD) or sputtering.

Then, an amorphous silicon film as a starting material of the active layer is formed at 500 Å by plasma CVD or low-pressure CVD. To shift the threshold voltage, the film is formed while diborane is added to a reactive gas of silane at 1–5 ppm.

In this state, the amorphous silicon film is irradiated with laser light according to the method of the invention.

After the glass substrate formed with the amorphous silicon film is placed in a laser irradiation chamber, the laser irradiation chamber is evacuated while oxygen, nitrogen, or hydrogen, or a mixture thereof is introduced into the chamber.

Figure 1:
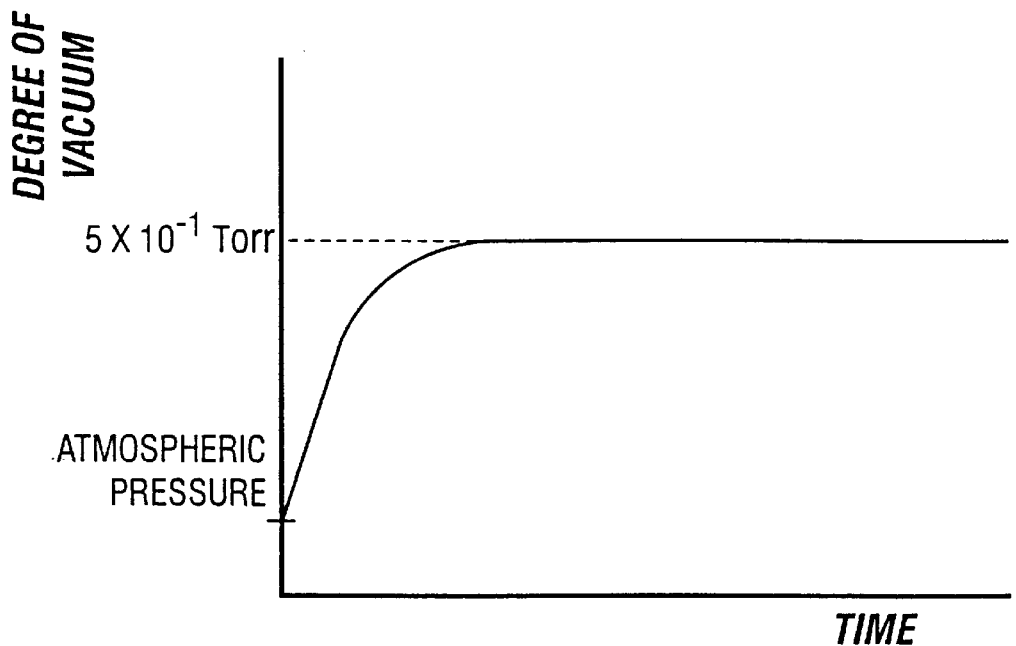
FIG. 1 shows a pressure variation in a laser irradiation chamber in Embodiment 1.

For example, the laser irradiation chamber is evacuated while oxygen is introduced thereinto. FIG. 1 shows a pressure variation in the laser irradiation chamber during the evacuation, in which the horizontal axis represents the time and the vertical axis represents the degree of vacuum in the laser irradiation chamber. The degree of vacuum becomes higher as the coordinate increases. A portion of the curve in FIG. 1 in which the degree of vacuum is constant corresponds to a pressure suitable for intended processing.

In this embodiment, the pressure in the irradiation chamber is decreased from the atmospheric pressure, the pressure is made constant after it reaches, for instance, 0.5 Torr, and the amorphous silicon film is crystallized by irradiating it with laser light at the constant pressure.

A measurement of a resulting crystallized silicon film showed a resistivity of $5 \times 10^5$ Ω.cm.

Comparative Example 1

For comparison with Embodiment 1, an experiment is conducted such that an active layer of a thin film semiconductor layer is crystallized by laser light irradiation with a conventional pressure setting scheme in which the degree of vacuum in a laser irradiation chamber is temporarily made high and then returned to the atmospheric pressure.

An amorphous silicon film for Comparative Example 1 is formed on a glass substrate in the same manner as in Embodiment 1. After the glass substrate formed with the amorphous silicon film is placed in a laser irradiation chamber, the laser irradiation chamber is evacuated while oxygen, nitrogen, hydrogen, or a mixture thereof is introduced into the chamber.

After the laser irradiation chamber is evacuated to $1 \times 10^{-5}$ Torr by a vacuum pump, the atmospheric pressure is again established by introducing oxygen.

Figure 2:
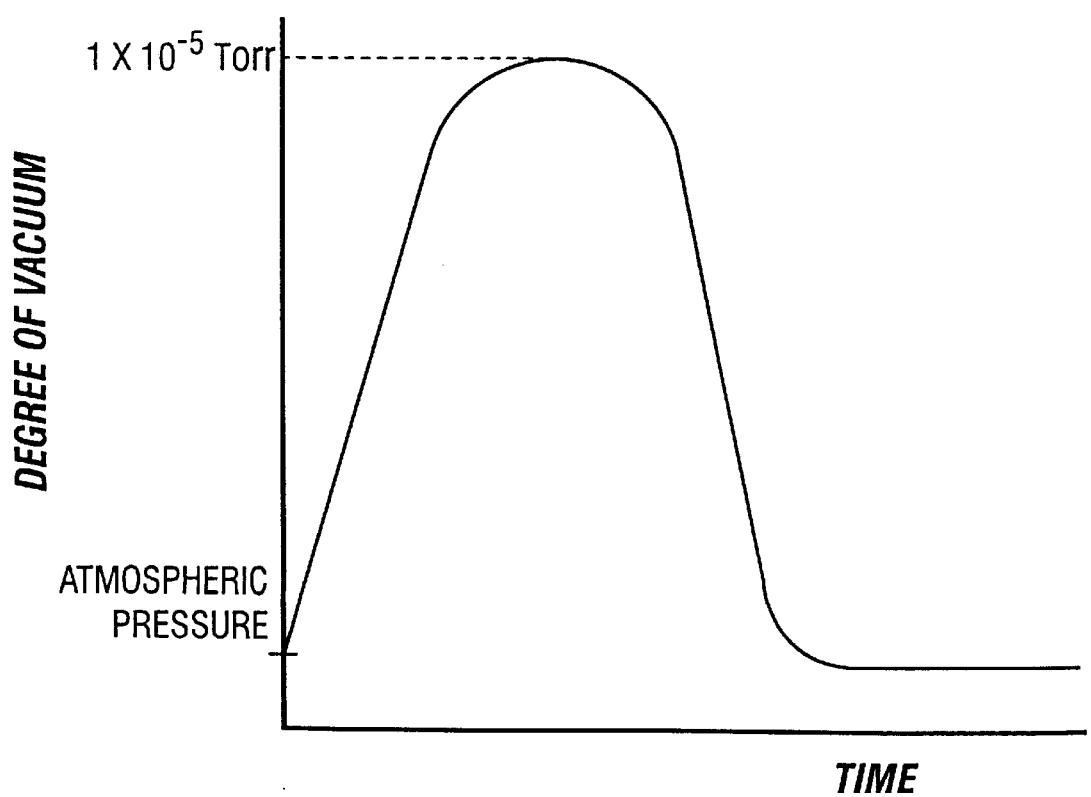
FIG. 2 shows a pressure variation in a laser irradiation chamber in Comparative Example 1.

FIG. 2 shows a pressure variation in the laser irradiation chamber. Like FIG. 1, FIG. 2 shows how the pressure in the irradiation chamber varies with time. In FIG. 2, a flat portion of the curve corresponds to the atmospheric pressure and a peak corresponds to $1 \times 10^{-5}$ Torr.

The pressure is made constant after it reached the atmospheric pressure, and laser irradiation is performed on the amorphous silicon film at the constant pressure.

A measurement of a resulting crystallized silicon film showed a resistivity of $6.5 \times 10^6$ Ω.cm.

Comparative Example 2

For comparison with Embodiment 1, an experiment is conducted such that an active layer of a thin film semiconductor layer is crystallized by laser light irradiation with a conventional pressure setting scheme in which the degree of vacuum in a laser irradiation chamber is temporarily made high and then returned to a pressure suitable for laser irradiation processing.

An amorphous silicon film for Comparative Example 2 is formed on a glass substrate in the same manner as in Embodiment 1. After the glass substrate formed with the amorphous silicon film is placed in a laser irradiation chamber, the laser irradiation chamber is evacuated while oxygen, nitrogen, hydrogen, or a mixture thereof is introduced into the chamber.

Figure 3:
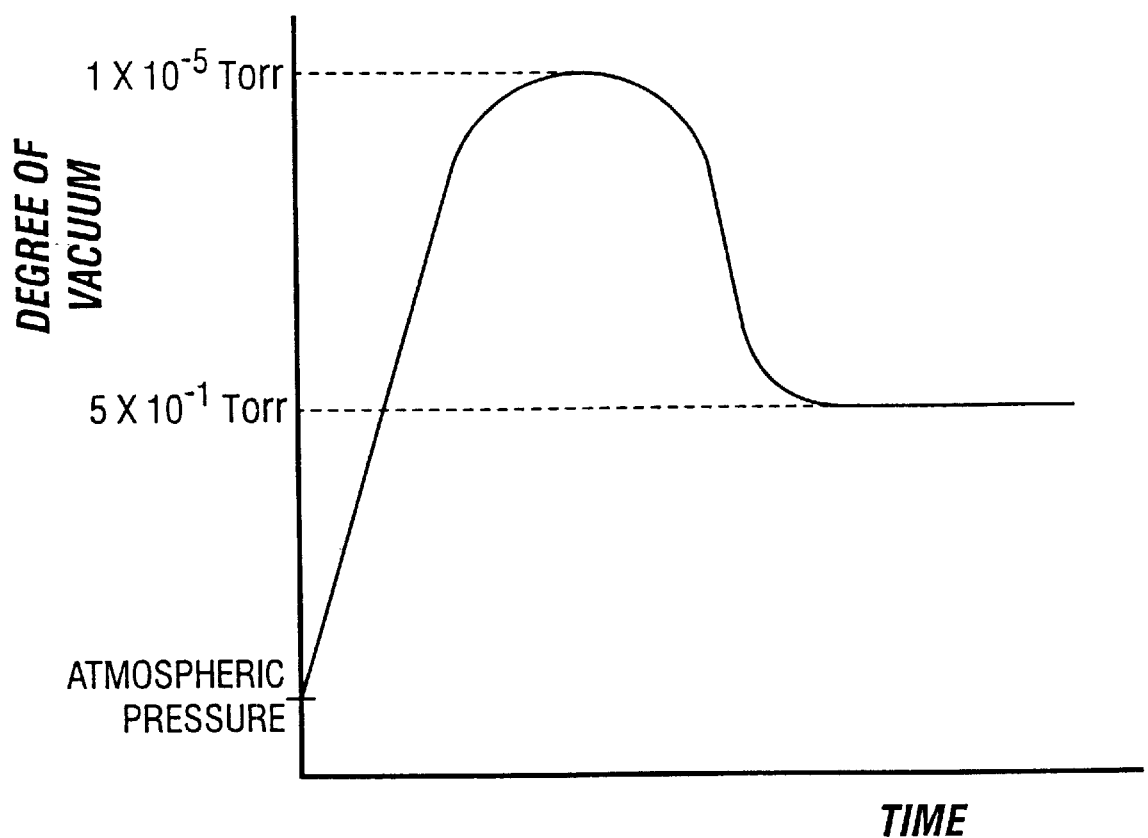
FIG. 3 shows a pressure variation in a laser irradiation chamber in Comparative Example 2.

After the laser irradiation chamber is evacuated to $1 \times 10^{-5}$ Torr by a vacuum pump, the pressure is increased to 0.5 Torr by introducing oxygen FIG. 3 shows a pressure variation in the laser irradiation chamber. Like FIGS. 1 and 2, FIG. 3 shows how the pressure in the irradiation chamber varies with time. In FIG. 3, a flat portion of the curve corresponds to 0.5 Torr and a peak corresponds to $1 \times 10^{-5}$ Torr.

The pressure is made constant after it reached 0.5 Torr, and the amorphous silicon film is crystallized by irradiating it with laser light at the constant pressure.

A measurement of a resulting crystallized silicon film showed a resistivity of $6.0 \times 10^6$ Ω.cm.

From Embodiment 1 and Comparative Examples 1 and 2, it can be said that the invention is effective in forming a film that is superior in electrical characteristics by crystallizing an amorphous silicon film.

Embodiment 2

Figure 4:
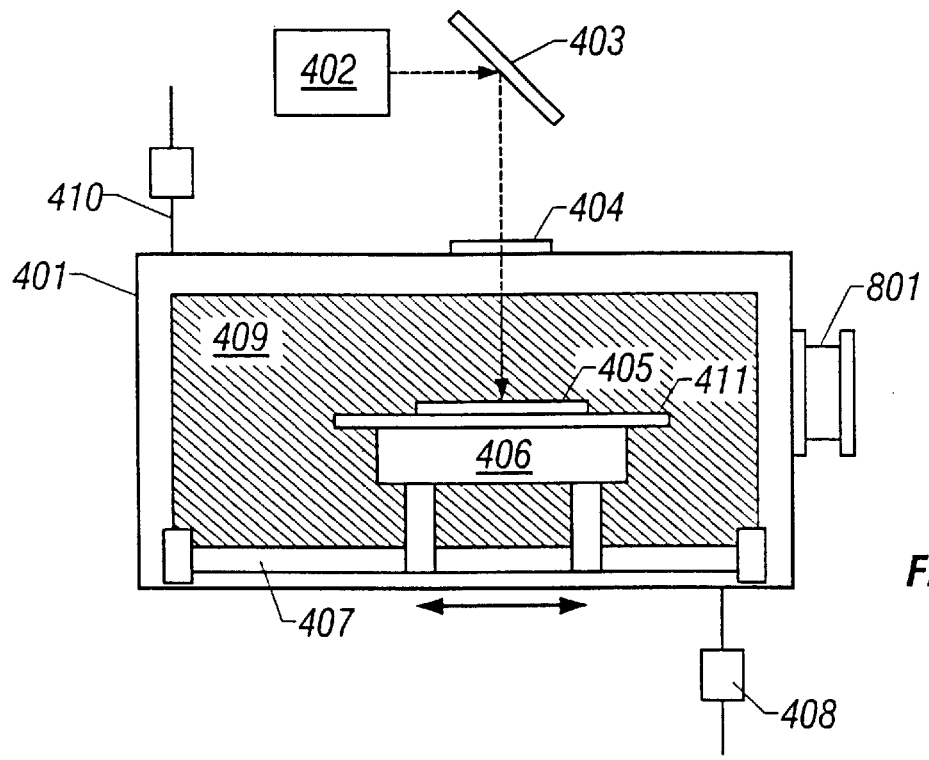
FIG. 4 is a side sectional view of a laser irradiation chamber according to Embodiment 2 of the invention.
Figure 5:
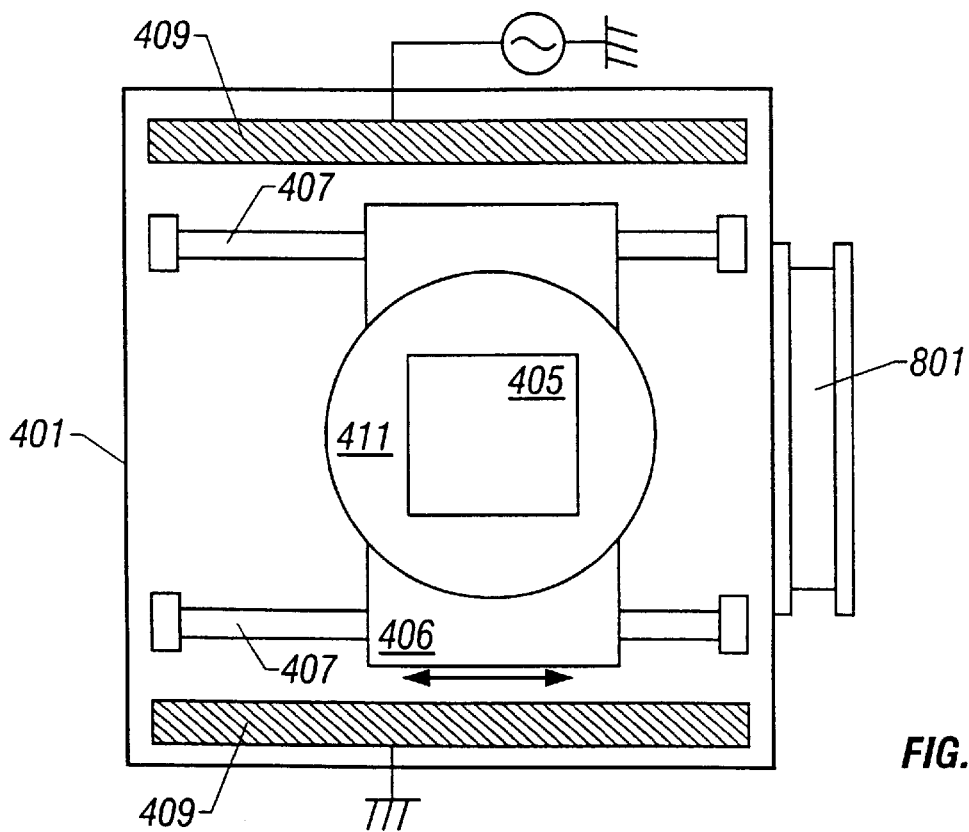
FIGS. 5 is a top of the laser irradiation chamber of FIG. 4.

FIG. 4 shows a laser irradiation apparatus to be used in practicing the invention. FIG. 5 is a top view of this apparatus.

A laser irradiation chamber 401 has a function of reflecting laser light that is irradiated from a laser oscillation device 402 by a mirror 403, and applying the reflected laser light to a substrate 405 via a quartz window 404. Linear laser light is used in this embodiment.

The substrate 405 is mounted on a substrate stage 411 of a base 406, and heated by a heater that is incorporated in the substrate stage 411 and thereby kept at a desired temperature (450–700° C.). The substrate stage 411 can be moved one-dimensionally by a moving mechanism 407.

Equipped with a vacuum pump 408, the laser irradiation chamber 401 can be rendered in a low-pressure or vacuum state when necessary.

The laser irradiation chamber 401 is also equipped with a pair of electrodes 409 and a gas supply system 410. The pair of electrodes 409 are respectively attached to side walls of the laser irradiation chamber 401.

Through a gate valve 801, the laser irradiation chamber 401 can be connected to another processing chamber.

A method of cleaning the inside of the laser irradiation chamber 401 by using plasma immediately before laser processing is performed in the chamber 401 will be described.

To eliminate organic impurities adhering to the inside surfaces of the laser irradiation chamber 401, the pressure in the irradiation chamber 401 is kept at 0.01–10 Torr, for instance, 0.02–0.03 Torr, by introducing a hydrogen, oxygen, or argon gas from the gas supply system 410. Then, a high-frequency energy of 13.56 MHz and 400 W, for instance, is applied to the pair of electrodes 409.

As a result, organic substances adhering to a substrate surface can be separated therefrom by impact, or converted into volatile oxides and eliminated.

To eliminate metals such as W, Si, Ti, V, As, Ge, P, B, etc. adhering to the inside surfaces of the laser irradiation chamber 401, the pressure in the irradiation chamber 401 is kept at 0.01–10 Torr by introducing a gas of nitrogen trifluoride ($NF_3$), sulfur hexafluoride ($SF_6$), $CF_4$, $ClF_3$, or the like from the gas supply system 410. Then, high-frequency energy of 13.56 MHz and 5–200 W, for instance, is applied to the pair of electrodes 409.

Another method for eliminating metals such as W, Si, Ti, V, As, Ge, P, B, etc. adhering to the inside surfaces of the laser irradiation chamber 401 is to use a non-plasma $ClF_3$ gas.

In this case, a $ClF_3$ gas is introduced from the gas supply system 410. As a result, the $ClF_3$ reacts with substances adhering to the inside surfaces of the irradiation chamber 401, and resulting heat of reaction activates the $ClF_3$ gas, thereby accelerating the reaction between the $ClF_3$ gas and the adhering substances. Thus, the substances adhering to the inside surfaces of the irradiation chamber 401 can be removed.

As for the conditions of the above cleaning process, it is preferred that the pressure be set in 0.1–100 Torr and the temperature of the $ClF_3$ gas be set in a range of its boiling point to 700° C. If the temperature of the $ClF_3$ gas is lower than the boiling point, there is a possibility that $ClF_3$ dew is formed on the inside surfaces of the irradiation chamber and the material constituting the irradiation chamber is impaired. If the temperature is higher than 700° C., the $ClF_3$ gas is activated and may also impair the material constituting the irradiation chamber. If the pressure is lower than 0.1 Torr, sufficient cleaning effects are not expected. If the pressure is higher than 100 Torr, the material constituting the irradiation chamber may be impaired.

In the apparatus for eliminating organic impurities from the substrate surface according to this embodiment, the pair of electrodes may be disposed at a top-left position in the irradiation chamber rather than attached to the side walls.

Figure 6:
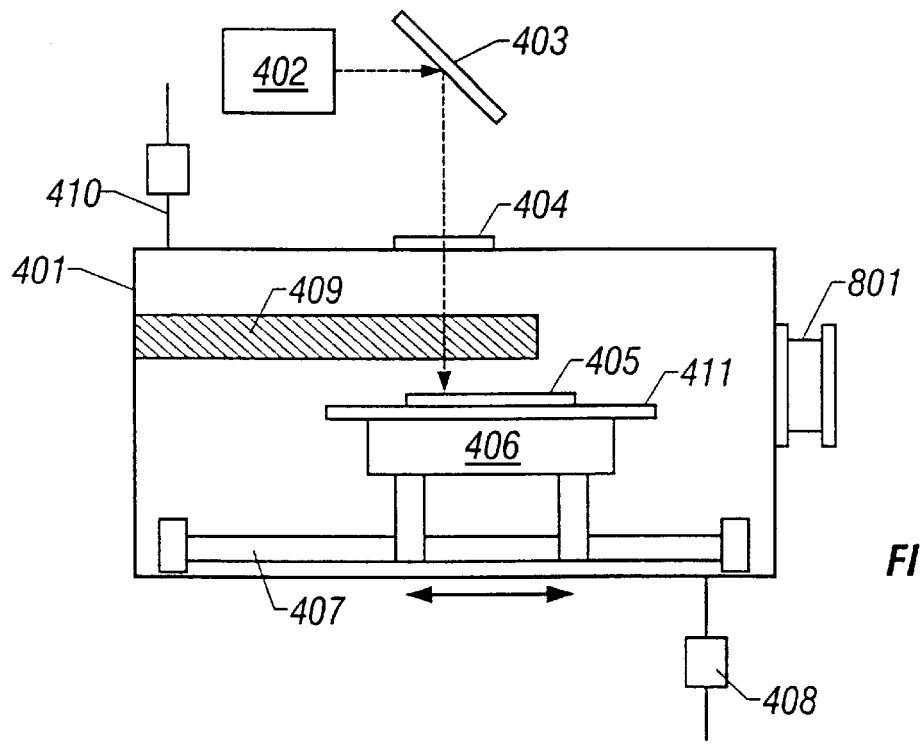
FIG. 6 is a side sectional view of another laser irradiation chamber according to Embodiment 2 of the invention.
Figure 7:
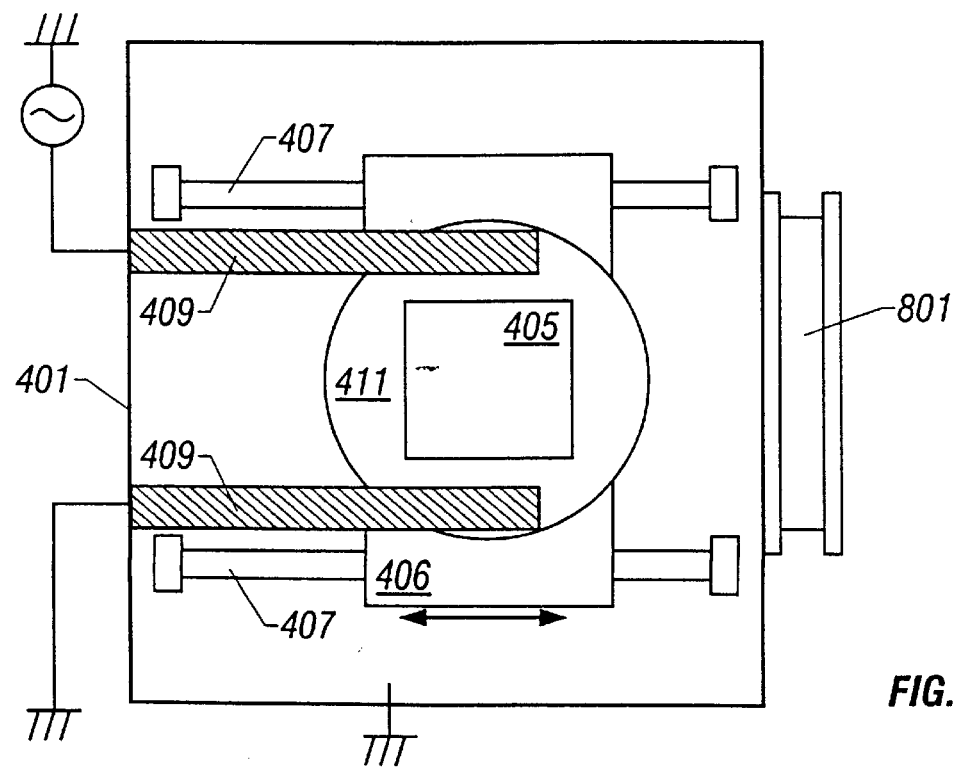
FIG. 7 is a top of the laser irradiation chamber of FIG. 6.

FIG. 6 is a side sectional view of such a laser irradiation apparatus, and FIG. 7 is its top view. In FIGS. 6 and 7, parts are given the same numerals as the corresponding parts in FIGS. 4 and 5.

Embodiment 3

This embodiment is relates to a method for eliminating organic impurities adhering to a substrate surface by using the apparatus of Embodiment 2 before laser light irradiation. A description will be made of a method for eliminating, by using oxygen or argon, organic impurities adhering to the substrate 405 mounted on the substrate stage 411 in the laser irradiation chamber 401, before laser light irradiation.

The pressure in the laser irradiation chamber 401 is kept at, for instance, 0.02–0.03 Torr by introducing an oxygen or argon gas from the gas supply system 410 into the irradiation chamber 401 where the substrate 405 is placed. High-freguency energy of, for instance, 13.56 MHz and 400 W is applied to the pair of electrodes 409.

As a result, organic substances adhering to the substrate surface can be separated therefrom by impact, or converted into volatile oxides and eliminated.

Embodiment 4

This embodiment relates to a case where etching on the inside surfaces of the irradiation chamber is performed during the laser light irradiation. More specifically, a description will be made of a case of crystallizing an amorphous silicon film by irradiating it with laser light by using the apparatus of FIGS. 4 and 5.

A 3,000-Å-thick silicon oxide film as an undercoat film is formed on a glass substrate by plasma CVD or sputtering.

An amorphous silicon film as a starting film of the active layer is formed at 500 Å by plasma CVD or low-pressure CVD. To shift the threshold voltage, the film is formed while diborane is added to a reactive gas of silane at 1–5 ppm.

The amorphous silicon film is crystallized by laser light irradiation by the apparatus of FIGS. 4 and 5. That is, after the substrate is transferred to the laser irradiation chamber 401, laser light is irradiated to the substrate surface while the substrate is moved. At the same time, the inside surfaces of the irradiation chamber 401 are etched in the manner described in Embodiment 2.

To eliminate organic impurities adhering to the inside surfaces of the irradiation chamber 401 during the laser light irradiation, the process of Embodiment 2 may be performed by introducing a hydrogen, oxygen, or argon gas from the gas supply system 410.

To eliminate metals such as W, Si, Ti, V, As, Ge, P, B, etc. adhering to the inside surfaces of the laser irradiation chamber 401 during the laser light irradiation, the process of Embodiment 2 may be performed by introducing a gas of nitrogen trifluoride ($NF_3$), sulfur hexafluoride ($SF_6$), $CF_4$, $ClF_3$, or the like from the gas supply system 410.

Another method for eliminating metals such as W, Si, Ti, V, As, Ge, P, B, etc. adhering to the inside surfaces of the laser irradiation chamber 401 is to use a ClF$_3$ gas.

In this case, a ClF$_3$ gas is introduced from the gas supply system 410. It is not necessary to apply high-frequency energy. As a result, the ClF$_3$ reacts with substances adhering to the inside surfaces of the irradiation chamber 401, and resulting heat of reaction activates the ClF$_3$ gas, thereby accelerating the reaction between the ClF$_3$ gas and the adhering substances. Thus, the substances adhering to the inside surfaces of the irradiation chamber 401 can be removed.

The amorphous silicon film is crystallized by applying laser light to the substrate surface.

The laser irradiation method of this embodiment can be used to anneal a semiconductor thin film that has been damaged by ion doping or the like.

Embodiment 5

This embodiment is directed to a process in which in addition to the feature of the invention that the pressure in the laser irradiation chamber is adjusted before the laser light irradiation, the inside surfaces of the irradiation chamber are etched during the laser light irradiation. This embodiment is advantageous in that by employing the method of the invention, that is, adjusting the pressure in the laser irradiation chamber before the laser light irradiation, the degree of impurity introduction into a laser irradiation object due to the laser light irradiation is lowered. In addition, by etching the inside surfaces of the laser irradiation chamber during the laser light irradiation, the degree of impurity introduction into the laser irradiation object can further be reduced.

This embodiment will be described for a process of producing a TFT to explain a case of applying the invention to both of a step of crystallizing an amorphous silicon film by laser light irradiation and an annealing step with laser light irradiation.

Figure 8:
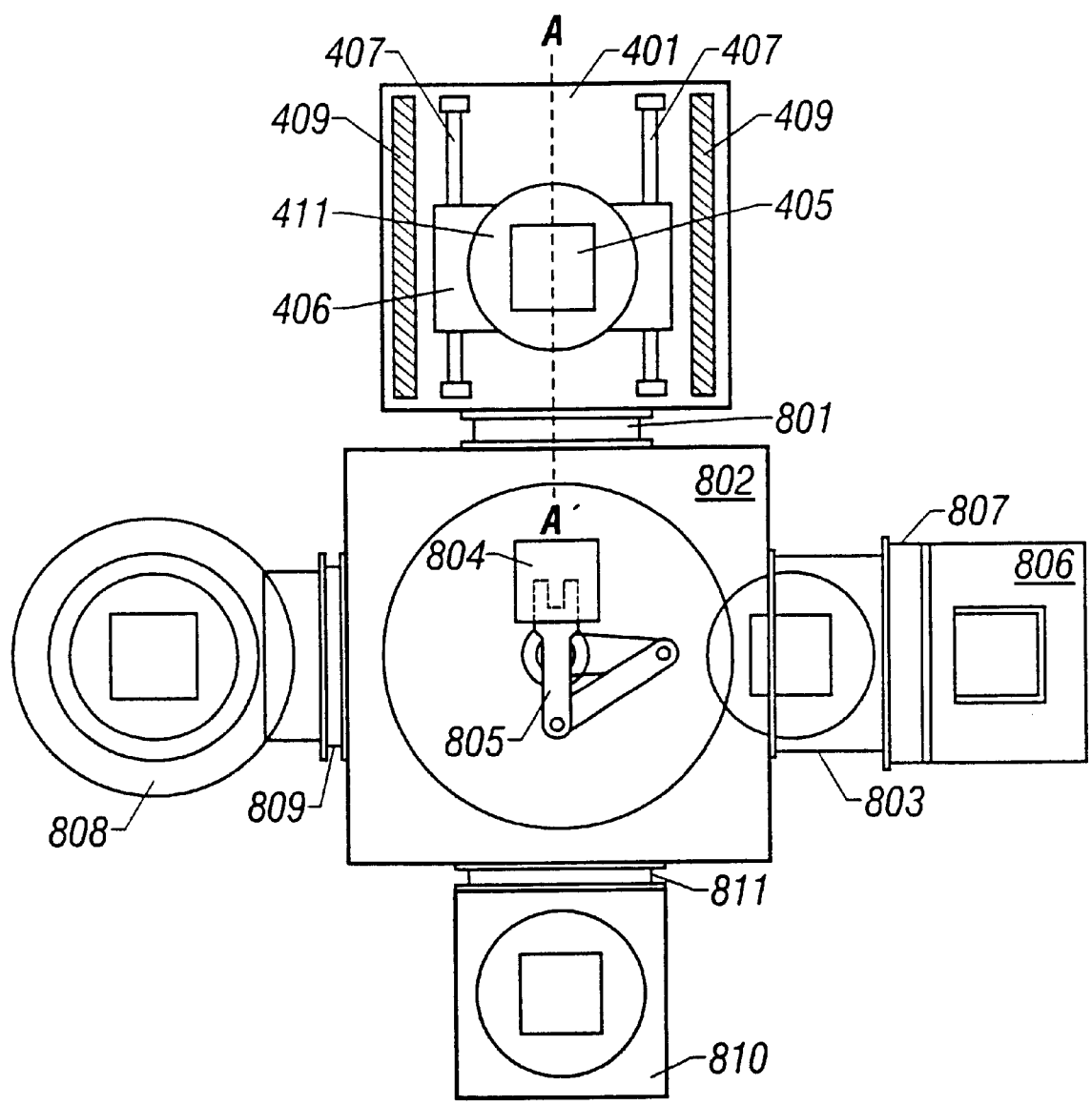
FIG. 8 shows a laser irradiation apparatus used in Embodiment 5.

A description will be made of an apparatus for practicing the embodiment. FIG. 8 is a schematic top view of a laser irradiation apparatus used in this embodiment. As shown in FIG. 8, the laser irradiation chamber 401 of FIG. 4 is connected to a substrate transfer chamber 802 via a gate valve 801. FIG. 4 corresponds to a cross section taken along line A–A' in FIG. 8.

The alignment chamber 803 is provided with an alignment mechanism. The alignment mechanism is moved vertically by an elevator, and has a function of adjusting the positional relationship between a substrate and a robot arm 805 by an operating mechanism. The alignment chamber 803 is connected to a substrate input/output chamber 806 via a gate valve 807. A heating chamber 808 is provided to preliminarily heat a substrate for irradiation to thereby increase its temperature to a given value. The purpose for heating the substrate is to make the laser light irradiation more effective.

The heating chamber 808 is a quartz cylinder and is provided with a substrate holder that is also made of quartz. Equipped with a susceptor, the substrate holder can accommodate a number of substrates. Further, the substrate holder is constructed such that it can be moved finely in the vertical direction by an elevator. In the heating chamber 808, substrates are heated by a heater. The heating chamber 808 is connected to the substrate transfer chamber 802 via a gate valve 809.

A substrate that has been heated preliminarily for a given time is drawn out, by a robot arm 805, to the substrate transfer chamber 802, where it is again aligned by the alignment mechanism.

The substrate is then transferred to the laser irradiation chamber 401 by the robot arm 805. The laser irradiation chamber 401 has the structure described in Embodiment 2.

After the laser light irradiation, the substrate 804 is drawn out to the substrate transfer chamber 802 by the robot arm 805 and then transferred to a slow cooling chamber 810. In this operation, the substrate 804 is again aligned with the robot arm 805 by the alignment mechanism.

The slow cooling chamber 810 is connected to the substrate transfer chamber 802 via a gate valve 811. The substrate mounted on a quartz stage is gradually cooled while being irradiated with infrared light coming from a lamp and reflecting plates.

The substrate that has been gradually cooled in the slow cooling chamber 810 is transferred to the substrate load/unload chamber 806 by the robot arm 805, and then again accommodated in a substrate holder. Thus, a laser light irradiation for one substrate is finished. To illuminate a number of substrates with laser light, this step may be performed consecutively.

A process of manufacturing a TFT will be described below with reference to a process of FIGS. 9A–9F to explain a step of crystallizing an amorphous silicon film by laser light irradiation and annealing with laser light irradiation, both steps being performed by using the above apparatus.

A 3,000-Å-thick silicon oxide film 902 as an undercoat film is formed on a glass substrate 901 by plasma CVD or sputtering.

An amorphous silicon film 903 as a starting film of the active layer is formed at 500 Å by plasma CVD or low-pressure CVD. To shift the threshold voltage, the film formation is performed while diborane is added to a reactive gas of silane at 1–5 ppm.

The amorphous silicon film is crystallized by laser light irradiation in the following manner by using the apparatus of FIG. 8.

As described above, the substrate is set to the substrate input/output chamber 806 and then transferred to the laser irradiation chamber 401. Thereafter, in the following manner, laser light is irradiated to the substrate surface while the substrate is moved and, at the same time, the inside surfaces of the laser irradiation chamber 401 are etched.

The laser irradiation chamber 401 is evacuated to a pressure at which the inside surfaces of the irradiation chamber 401 are to be etched while a gas (described below) that is necessary for the etching is introduced into the irradiation chamber 401.

For example, the laser irradiation chamber 401 is evacuated while oxygen is introduced thereinto. FIG. 1 schematically shows a pressure variation in the laser irradiation chamber 401.

Figure 9A:
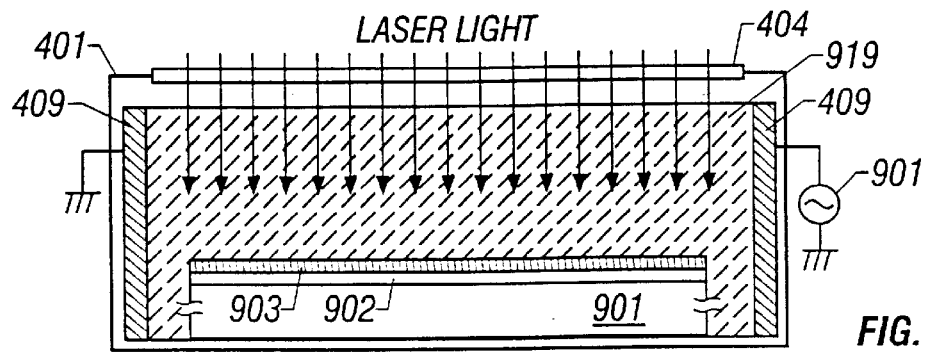
FIGS. 9A, 9B, 9C, 9D and 9F show a manufacturing process according to Embodiment 5.

The pressure is kept constant after it reaches a given value, for instance, 0.5 Torr. In this state, the amorphous silicon film 903 is crystallized by irradiating it with laser light and, at the same time, the inside surfaces of the laser irradiation chamber 401 are etched in the following manner. (FIG. 9A)

In FIGS. 9A, 9B, 9C, 9D and 9F, numeral 901 and 919 are a high-frequency power supply and an etching gas, respectively.

A description will be made of a gas used and conditions of the etching step.

To eliminate organic impurities adhering to the inside surfaces of the laser irradiation chamber 401 during the laser light irradiation, the pressure in the irradiation chamber 401 is kept at 0.01–10 Torr, for instance, 0.02–0.03 Torr, by introducing a hydrogen, oxygen, or argon gas from the gas supply system 410. Then, high-frequency energy of 13.56 MHz and 400 W, for instance, is applied to the pair of electrodes 409.

As a result, organic substances adhering to a substrate surface can be separated therefrom by impact, or converted into volatile oxides and eliminated.

To eliminate metals such as W, Si, Ti, V, As, Ge, P, B, etc. adhering to the inside surfaces of the laser irradiation chamber 401 during the laser light irradiation, the pressure in the irradiation chamber 401 is kept at 0.01–10 Torr by introducing a gas of nitrogen trifluoride ($NF_3$), sulfur hexafluoride ($SF_6$), $CF_4$, $ClF_3$, or the like from the gas supply system 410. Then, high-frequency energy of 13.56 MHz and 5–200 W, for instance, is applied to the pair of electrodes 409.

Another method for eliminating metals such as W, Si, Ti, V, As, Ge, P, B, etc. adhering to the inside surfaces of the laser irradiation chamber 401 is to use a $ClF_3$ gas.

In this case, a $ClF_3$ gas is introduced from the gas supply system 410. It is not necessary to apply high-frequency energy. As a result, the $ClF_3$ reacts with substances adhering to the inside surfaces of the irradiation chamber 401, and resulting heat of reaction activates the $ClF_3$ gas, thereby accelerating the reaction between the $ClF_3$ gas and the adhering substances. Thus, the substances adhering to the inside surfaces of the irradiation chamber 401 can be removed.

As for the conditions of the above cleaning process, it is preferred that the pressure be set in 0.1–100 Torr and the temperature of the $ClF_3$ gas be set in a range of its boiling point to 700° C. If the temperature of the $ClF_3$ gas is lower than the boiling point, there is a possibility that $ClF_3$ dew is formed on the inside surfaces of the irradiation chamber and the material constituting the irradiation chamber is impaired. If the temperature is higher than 700° C., the $ClF_3$ gas is activated and may also impair the material constituting the irradiation chamber. If the pressure is lower than 0.1 Torr, sufficient cleaning effects are not expected. If the pressure is higher than 100 Torr, the material constituting the irradiation chamber may be impaired.

After the pressure in the laser irradiation chamber 401 is adjusted in the above manner, the amorphous silicon film 903 is crystallized by irradiating it with laser light while the inside of the irradiation chamber 401 is cleaned.

After the crystallization of the amorphous silicon film 903, the substrate is transferred to the substrate input/output chamber 806 as described above.

Thereafter, an active layer 904 of a TFT is obtained by patterning the crystallized silicon film. A 1,000-Å-thick silicon oxide film 905 to serve as a gate insulating film is formed thereon by plasma CVD.

An aluminum film for a gate electrode is then formed by sputtering or electron beam evaporation. To suppress occurrence of hillocks and whiskers in subsequent steps, one or a plurality of elements selected from Sc, Y, lanthanoids, and actinoids are added to the aluminum film. In this embodiment, Sc is added at 0.1 wt %.

Hillocks and whiskers are needle-like or prickle-like protrusions that may be formed on the surface of an aluminum film when it is heated to more than 300° C. or irradiated with laser light.

Further, to improve the adhesiveness of a resist mask to be formed on the aluminum film in the following step, a very thin, dense anodic oxide film (not shown) is formed on the surface of the aluminum film.

The anodization is performed in an electrolyte obtained by neutralizing an ethylene glycol solution containing 3%-tartaric acid with aqueous ammonia, using the aluminum film and a platinum plate as anode and cathode, respectively. The thickness of a resulting dense anodic oxide film is set at 150 Å. The thickness can be generally controlled by the applied voltage.

By virtue of the dense anodic oxide film (not shown) formed on the aluminum film, a resist mask can be brought into close contact with the aluminum film without formation of any gaps. The resist mask is formed by using another mask.

Figure 9B:
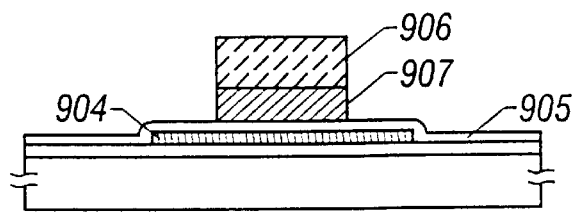

A gate electrode 907 and a gate line (not shown) extending therefrom are formed by patterning the aluminum film by using the resist mask. Thus, a state of FIG. 9B is obtained.

With the resist mask left as it is, porous anodic oxide films 909 are formed in an electrolyte that is a 3% aqueous solution of oxalic acid. More specifically, with the aluminum pattern of FIG. 9B and a platinum plate respectively used as the anode and the cathode, current is caused to flow therebetween in the above aqueous solution.

Since the aluminum pattern is covered with the resist mask 906, the electrolyte does not contact with the top surfaces of the aluminum pattern and hence the anodization proceeds only on the side faces of the pattern.

The anodization is performed by supplying current through current supply lines for anodization, which are used to prevent a phenomenon that voltage drops would otherwise cause resulting anodic oxide films to have different thicknesses at opposite ends of an active matrix region. In particular, the use of the current supply lines is necessary for manufacture of a large-area liquid crystal panel.

The growth length of the porous anodic oxide films 909 can be controlled by the anodization time, and selected from an approximate range of 3,000–10,000 Å. In this embodiment, the width (growth length) of the porous anodic oxide films 909 is set at 5,000 Å. The dimension of low-concentration impurity regions (formed later) is generally determined by the growth length of the porous anodic oxide films 909.

As described later in detail, the porous anodic oxide films 909 have the following important roles:

formation of low-concentration impurity regions (generally called LDD regions); and reducing the occurrence of defects at two-level crossing portions of the first-layer wiring lines and the second-layer wiring lines.

After the formation of the porous anodic oxide films 909 (see FIG. 9C), the resist mask 906 and the 150-Å-thick dense anodic oxide film (not shown) are removed.

A dense anodic oxide film 908, which is very effective in suppressing the occurrence of hillocks and whiskers, is in an electrolyte that is obtained by neutralizing an ethylene glycol solution containing 3%-tartaric acid with aqueous ammonia.

In this step, the dense anodic oxide film 908 is formed on the surface of the electrode 910 that is composed of residual aluminum because the electrolyte goes into the porous anodic oxide films 909.

Also in this anodization step, anodization current is supplied through the current supply lines for anodization. This is to uniformize the thickness of resulting anodic oxide films over the entire area concerned.

The thickness of the dense anodic oxide film 908 is set at 800 Å. If the thickness of the dense anodic oxide film 908 is set large (for example, more than 2,000 Å), offset gate regions can be formed later in the active layer with a corresponding width. However, to form a thick dense anodic oxide film, the application voltage should be set as high as more than 200 V, which is not preferable in terms of the reproducibility and safety of the operation. Thus, in this embodiment, the thickness of the dense anodic oxide film 908 is set at 800 Å to obtain such advantages as suppression of the occurrence of hillocks and whiskers and improvement in breakdown voltage.

Figure 9C:
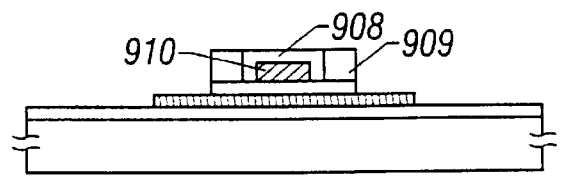

Therefore, a gate electrode 910 is formed as shown in FIG. 9C. After the above anodization, the gate electrode 910 has smaller dimensions than the electrode 907 shown in FIG. 9B.

The porous anodic oxide films 909 are removed. They can be removed selectively by using a mixed acid of phosphoric acid, acetic acid, and nitric acid.

Figure 9D:
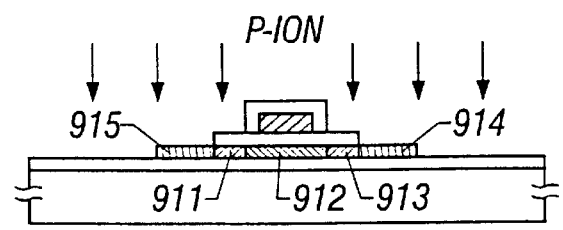

Thus, a state of FIG. 9D is obtained. In this state, impurity ions are implanted to form source and drain regions of the TFT. In this embodiment, P ions are implanted to form an N-channel TFT, To form a P-channel TFT, B ions may be implanted.

In this step, a source region 915 and a drain region 914 as well as low concentration impurity regions 911 and 913 are formed in a self-alignment. The low concentration impurity region 913, which is formed between a channel forming region 912 and the drain region 914, is generally called a LDD (lightly doped drain) region. (FIG. 9D)

The low concentration impurity region 913 is very effective in obtaining a TFT having a small off current. In particular, TFTs to be formed at pixels of an active matrix region are required to have a small off current. The formation of the low-concentration impurity region 913 is therefore effective in producing such TFTs.

After the implantation of impurity ions, laser light is irradiated to activate the implanted impurity ions and to anneal the regions damaged by the ion implantation.

The method of the invention is used in the following manner to obtain a pressure necessary for this annealing.

The substrate is set to the substrate load/unload chamber 806 of the apparatus of FIG. 8 and then transferred to the laser irradiation chamber 401 in the manner described above.

An etching gas is introduced into the laser irradiation chamber 401 from the gas supply system 410 in accordance with the type of etching described below. The pressure is kept constant after it reaches a value suitable for the etching.

Figure 9E:
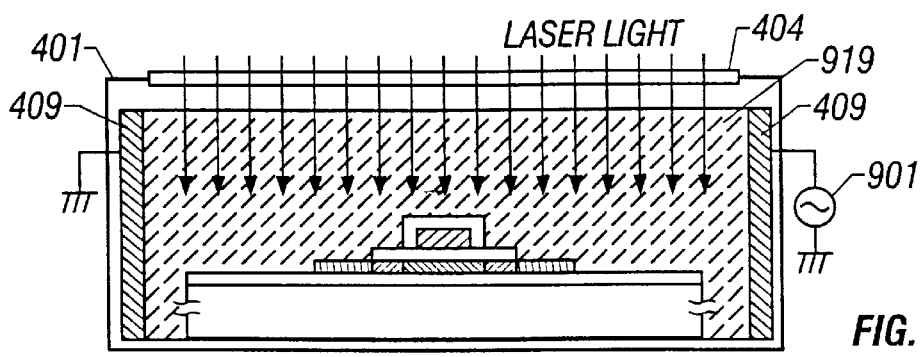
Figure 9F:
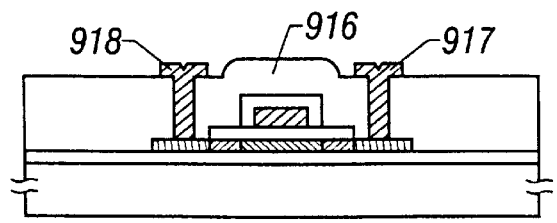

Thereafter, laser light is irradiated to the substrate surface while the substrate is moved, and, at the same time, the inside surfaces of the laser irradiation chamber 401 are etched under the following conditions. (FIG. 9E)

To eliminate organic impurities adhering to the inside surfaces of the irradiation chamber 401 during the laser light irradiation, a process similar to the case of the crystallization by laser light irradiation may be performed by introducing a hydrogen, oxygen, or argon gas from the gas supply system 410.

To eliminate metals such as W, Si, Ti, V, As, Ge, P, B, etc. adhering to the inside surfaces of the laser irradiation chamber 401 during the laser light irradiation, a process similar to the case of the crystallization may be performed by introducing a gas of nitrogen trifluoride ($NF_3$), sulfur hexafluoride ($SF_6$), $CF_4$, $ClF_3$, or the like from the gas supply system 410.

Another method for eliminating metals such as W, Si, Ti, V, As, Ge, P, B, etc. adhering to the inside surfaces of the laser irradiation chamber 401 is to use a $ClF_3$ gas.

In this case, a $ClF_3$ gas is introduced from the gas supply system 410. It is not necessary to apply high-frequency energy. As a result, the $ClF_3$ reacts with substances adhering to the inside surfaces of the irradiation chamber 401, and resulting heat of reaction activates the $ClF_3$ gas, thereby accelerating the reaction between the $ClF_3$ gas and the adhering substances. Thus, the substances adhering to the inside surfaces of the irradiation chamber 401 can be removed.

After the activation of implanted impurity ions and the annealing of the regions damaged by the ion implantation, the substrate is transferred to the substrate load/unload chamber 806 in the manner described above.

Then, a 4,000-Å-thick silicon oxide film to serve as a first interlayer insulating film 916 is formed by plasma CVD using a TEOS material gas.

The interlayer insulating film 916 may be made of a silicon nitride film or a silicon oxynitride film. A silicon nitride film may be formed by plasma CVD using an ammonia material gas. A silicon oxynitride film may be formed by plasma CVD using a TEOS gas and a $N_2O$ gas.

As a further alternative, the first interlayer insulating film 916 may be made of a multilayer film of plural kinds of films selected from a silicon oxide film, a silicon nitride film, and a silicon oxynitride film.

After the formation of the first interlayer insulating film 916, contact holes are formed through it. A third mask is used in this step.

Thereafter, second-layer electrodes and wirings (usually called second-layer wirings) 917 and 918 are formed.

Thus, a TFT is completed.

Although in this embodiment the 3,000-Å-thick silicon oxide film 902 as the undercoat film is formed on the glass substrate by plasma CVD or sputtering without conducting any preliminary step, there may be performed, before the formation of the silicon oxide film 902, the step of Embodiment 3 for eliminating organic impurities adhering to the substrate surface by using the apparatus of FIG. 8.

According to the invention, in crystallizing or annealing a single-crystal semiconductor layer formed on a substrate in a laser irradiation chamber, the pressure in the chamber is kept constant after it reaches a pressure suitable for the crystallization or annealing, and the non-single crystal semiconductor layer is irradiated with laser light in this state. With this method, introduction of impurities into the non-single-crystal semiconductor layer becomes less likely, so that it becomes possible to produce a non-single-crystal semiconductor layer having superior electrical characteristics.

According to the invention, there is provided a laser irradiation apparatus comprising a unit for placing an object to be processed inside the laser irradiation apparatus; a unit for irradiating the object with laser light; and an electrode for supplying electrical energy to a space inside the laser irradiation chamber. This configuration allows the laser light irradiation in the chamber and the cleaning of the chamber to be performed at the same time.

According to the invention, in crystallizing or annealing a single-crystal semiconductor layer formed on a substrate in a laser irradiation chamber, the non-single crystal semiconductor layer is irradiated with laser light and, at the same time, the inside of the chamber is cleaned. This method enables production of TFTs having superior characteristics.

According to the invention, in crystallizing or annealing a single-crystal semiconductor layer formed on a substrate in a laser irradiation chamber, the pressure in the chamber is kept constant after it reaches a pressure suitable for the crystallization or annealing, and the non-single crystal semiconductor layer is irradiated with laser light in this state while the inside of the chamber is cleaned. This method makes it possible to produce a non-single-crystal semiconductor layer having even superior electrical characteristics.

What is claimed:

1. A method for forming a semiconductor device comprising:

placing a semiconductor in a laser irradiation chamber;

reducing a pressure in said chamber to a predetermined pressure in a range between 1 atmosphere of pressure to $1\times10^{-5}$ torr whereby said predetermined pressure is suitable for laser irradiation processing;

maintaining said semiconductor in said chamber at said predetermined pressure;

crystallizing said semiconductor by irradiating said semiconductor with laser light in said laser irradiation chamber under said predetermined pressure;

introducing a cleaning gas into said chamber; and applying an oscillating electric field in said chamber after said cleaning gas is introduced to cause said cleaning gas to remove a substance located in an area within said chamber.

2. A method for forming a semiconductor device comprising;

forming a non-single crystal semiconductor layer on a substrate;

placing said substrate in a laser irradiation chamber;

reducing a pressure in said chamber to a predetermined pressure in a range between 1 atmosphere of pressure to $1\times10^{-5}$ torr whereby said predetermined pressure is suitable for laser irradiation processing;

applying laser light in said laser irradiation chamber to crystallize said non-single crystal semiconductor layer under said predetermined pressure;

introducing a cleaning gas into said chamber; and applying an oscillating electrical field in said chamber after said cleaning gas is introduced to cause said cleaning gas to remove a substance located in an area within said chamber.

3. The method of claim 2 wherein said non-single crystal semiconductor layer comprises an amorphous silicon.

4. A method for forming a semiconductor device comprising:

forming a non-single crystal semiconductor layer on a substrate;

placing said substrate in a laser irradiation chamber;

reducing a pressure in said chamber to a predetermined pressure in a range between 1 atmosphere of pressure to $1\times10^{-5}$ torr whereby said predetermined pressure is suitable for laser irradiation processing;

applying linear laser light in said laser irradiation chamber to crystallize said non-single crystal semiconductor layer under said predetermined pressure;

introducing a cleaning gas into said chamber; and applying an oscillating electrical field in said chamber after said cleaning gas is introduced to cause said cleaning gas to remove a substance located in an area within said chamber.

5. The method of claim 4 wherein said non-single crystal semiconductor layer comprises an amorphous silicon.

6. A method for forming a semiconductor device comprising:

forming a non-single crystal semiconductor layer on a substrate;

placing said substrate in a laser irradiation chamber;

reducing a pressure in said chamber to a predetermined pressure in a range between 1 atmosphere of pressure to $1\times10^{-5}$ torr whereby said predetermined pressure is suitable for laser irradiation processing;

cleaning an inside of said laser irradiation chamber by using an RF field to excite a cleanining gas;

applying laser light in said laser irradiation chamber to crystallize said non-single crystal semiconductor layer under said predetermined pressure; and applying an oscillating electrical field in said chamber after said cleaning gas is introduced into said chamber to cause said cleaning gas to remove a substance located in an area within said chamber, wherein said cleaning is carried out before the applciation of said laser light.

7. The method of claim 6 wherein said non-single crystal semiconductor layer comprises an amorphous silicon.

8. A method for forming a semiconductor device comprising;

forming a non-single crystal semiconductor layer on a substrate;

placing a substrate in a laser irradiation chamber;

cleaning an inside of said laser irradiation chamber by using an RF field to excite a cleaning gas at a pressure of 0.01 to 1 Torr obtained by reducing a pressure in said chamber;

applying laser light in said laser irradiation chamber to crystallize said non-single crystal semiconductor layer; and applying an oscillating electrical field in said chamber after said cleaning gas is introduced into said chamber to cause said cleaning gas to remove a substance located in an area within said chamber, wherein said cleaning is carried out before the application of said laser light.

9. The method of claim 8 wherein said non-single crystal semiconductor layer comprises an amorphous silicon.

10. The method of claim 8 wherein said cleaning is a plasma cleaning.

11. The method of claim 8 wherein said cleaning gas is a gas selected from the group consisting of $NF_3$, $SF_6$, $CF_4$, and $ClF_3$.

12. A method for forming a semiconductor device comprising:

forming a non-single crystal semiconductor layer on a substrate;

crystallizing said semiconductor layer;

implanting an impurity into said semiconductor layer to form a source region and a drain region in said semiconductor layer and to form a channel forming region in said semiconductor layer between said source region and said drain region;

reducing a pressure in a laser irradiation chamber to a predetermined pressure in a range between 1 atmosphere of pressure to $1\times10^{-5}$ torr whereby said predetermined pressure is sutiable for laser irradiation processing;

applying laser light in said laser irradiation chamber to anneal a region of said semiconductor layer damaged by the implantation of said impurity under said predetermined pressure;

introducing a cleaning gas into said chamber; and applying an oscillating electrical field in said chamber after said cleaning gas is introduced to cause said cleaning gas to remove a substance located in an area within said chamber.

13. The method of claim 12 wherein said non-single crystal semiconductor layer comprises an amorphous silicon.

14. A method for forming a semiconductor device comprising:

placing a semiconductor in a laser irradiation chamber;

reducing a pressure in said chamber to a predetermined pressure in a range between 1 atmosphere of pressure to $1\times10^{-5}$ torr whereby said predetermined pressure is suitable for laser irradiation processing;

maintaining said semiconductor in said chamber at said predetermined pressure;

crystallizing said semiconductor by irradiating said semiconductor with linear laser light in said laser irradiation chamber under said predetermined pressure;

introducing a cleaning gas into said chamber; and applying an oscillating electric field in said chamber after said cleaning gas is introduced to cause said cleaning gas to remove a substance located in an area within said chamber.

15. A method for forming a semiconductor device comprising:

placing a semiconductor in a laser irradiation chamber;

reducing a pressure in said chamber to a predetermined pressure in a range between 1 atmosphere of pressure to $1\times10^{-5}$ torr whereby said predetermined pressure is suitable for laser irradiation processing;

cleaning an inside of said laser irradiation chamber by using and RF field to excite a cleaning gas;

maintaining said semiconductor in said chamber at said predetermined pressure;

crystallizing said semiconductor by irradiating said semiconductor with laser light in said laser irradiation chamber under said predetermined pressure; and applying an oscillating electric field in said chamber after said cleaning gas is introduced into said chamber to cause said cleaning gas to remove a substance located in an area within said chamber, wherein said cleaning is carried out before the irradiation of said semiconductor with said laser light.

16. A method for forming a semiconductor device comprising;

placing a semiconductor in a laser irradiation chamber;

cleaning an inside of said laser irradiation chamber by using an RF field to excite a cleaning gas at a pressure of 0.01 to 1 Torr obtained by reducing a pressure in said chamber;

crystallizing said semiconductor by irradiating said semiconductor with laser light in said laser irradiation chamber; and applying an oscillating electric field in said chamber after said cleaning gas is introduced into said chamber to cause said cleaning gas to remove a substance located in an area within said chamber, wherein said cleaning is carried out before the irradiation of said semiconductor with said laser light.

* * * * *